United States Patent
Shacham

(10) Patent No.: US 7,562,055 B2
(45) Date of Patent: Jul. 14, 2009

(54) RESOLVE TRACE MINIMIZATION

(75) Inventor: Ohad Shacham, Kfar Monash (IL)

(73) Assignee: International Business Machines Corporation, Armonk, NY (US)

( * ) Notice: Subject to any disclaimer, the term of this patent is extended or adjusted under 35 U.S.C. 154(b) by 323 days.

(21) Appl. No.: 11/532,558

(22) Filed: Sep. 18, 2006

(65) Prior Publication Data

US 2008/0082471 A1    Apr. 3, 2008

(51) Int. Cl.
*G06E 1/00*    (2006.01)
*G06E 3/00*    (2006.01)
*G06G 7/00*    (2006.01)
*G06F 15/18*   (2006.01)

(52) U.S. Cl. ........................................ 706/16
(58) Field of Classification Search ........................ None
See application file for complete search history.

(56) References Cited

U.S. PATENT DOCUMENTS

| | | | | |
|---|---|---|---|---|
| 5,680,518 A * | 10/1997 | Hangartner | ................. | 706/52 |
| 6,496,961 B2 | 12/2002 | Gupta et al. | | |
| 6,556,978 B1 * | 4/2003 | Ginsberg et al. | ............. | 706/19 |
| 6,912,700 B1 * | 6/2005 | Franco et al. | ................... | 716/5 |
| 7,036,115 B2 * | 4/2006 | Nelson | ....................... | 717/151 |
| 7,143,382 B2 * | 11/2006 | Teig et al. | ..................... | 716/12 |
| 7,155,697 B2 * | 12/2006 | Teig et al. | ..................... | 716/13 |
| 7,187,672 B1 * | 3/2007 | Vishnu | ....................... | 370/360 |
| 7,236,965 B2 * | 6/2007 | Iyer | ........................... | 706/46 |
| 7,243,087 B2 * | 7/2007 | Iyer | ........................... | 706/46 |
| 7,249,333 B2 * | 7/2007 | Yu et al. | ....................... | 716/5 |
| 7,272,707 B2 * | 9/2007 | Liu et al. | ....................... | 713/1 |
| 7,299,432 B2 * | 11/2007 | Baumgartner et al. | ......... | 716/4 |
| 7,350,166 B2 * | 3/2008 | Baumgartner et al. | ......... | 716/3 |
| 7,350,179 B2 * | 3/2008 | Baumgartner et al. | ......... | 716/18 |
| 7,367,002 B2 * | 4/2008 | Baumgartner et al. | ......... | 716/5 |
| 7,370,298 B2 * | 5/2008 | Baumgartner et al. | ......... | 716/4 |
| 7,380,224 B2 * | 5/2008 | Franco et al. | .................. | 716/4 |
| 7,386,828 B1 * | 6/2008 | Safarpour et al. | ............. | 716/17 |
| 7,398,498 B2 * | 7/2008 | Teig et al. | ..................... | 716/12 |
| 7,401,305 B2 * | 7/2008 | Shacham et al. | ............... | 716/5 |
| 7,440,942 B2 * | 10/2008 | Dixon et al. | ................... | 707/5 |
| 7,441,216 B1 * | 10/2008 | Shacham et al. | ............... | 716/5 |
| 7,490,234 B2 * | 2/2009 | Liu et al. | ....................... | 713/1 |
| 7,493,581 B2 * | 2/2009 | Siegel et al. | ................... | 716/9 |

OTHER PUBLICATIONS

Solution and Optimization of Systems of Pseudo-Boolean Constraints Aloul, F.A; Ramani, A.; Sakallah, K.A.; Markov, I.L.; Computers, IEEE Transactions on vol. 56, Issue 10, Oct. 2007 pp. 1415-1424 Digital Object Identifier 10.1109/TC.2007.1075.*

(Continued)

*Primary Examiner*—Michael B Holmes

(57) ABSTRACT

Systems and methods for minimizing a resolve trace are provided. The method comprises identifying at least a first clause that won't take part in determining the final result; removing at least a first resolve source associated with the first clause from the resolve trace, wherein the first clause is a disjunction of one or more literals that define the SAT problem; and removing the first resolve source from the resolve trace, in response to said first clause not having any children.

13 Claims, 9 Drawing Sheets

OTHER PUBLICATIONS

Hybrid SAT Solver Considering Circuit Observability Xiuqin Wang; Hao Wang; Guangsheng Ma; Young Computer Scientists, 2008. ICYCS 2008. The 9th International Conference for Nov. 18-21, 2008 pp. 65-70 Digital Object Identifier 10.1109/ICYCS.2008.84.*

Solving the Minimum-Cost Satisfiability Problem Using SAT Based Branch-and-Bound Search Zhaohui Fu; Malik, S.; Computer-Aided Design, 2006. ICCAD '06 . IEEE/ACM International Conference on Nov. 5-9, 2006 pp. 852-859 Digital Object Identifier 10.1109/ICCAD.2006.320089.*

Identifying the Shortest Path in Large Networks using Boolean Satisfiability Aloul, F.A.; Rawi, B.A.; Electrical and Electronics Engineering, 2006 3rd International Conference on Sep. 6-8, 2006 pp. 1-4 Digital Object Identifier 10.1109/ICEEE.2006.251924.*

Evolving a Neural Net-Based Decision and Search Heuristic for DPLL SAT Solvers Kibria, R.H.; Neural Networks, 2007. IJCNN 2007. International Joint Conference on Aug. 12-17, 2007 pp. 765-770 Digital Object Identifier 10.1109/IJCNN.2007.4371054.*

A Hardware Accelerator for SAT Solving Safar, M.; Shalan, M.; El-Kharashi, M.W.; Salem, A.; Computer Engineering and Systems, The 2006 International Conference on Nov. 5-7, 2006 pp. 132-135 Digital Object Identifier 10.1109/ICCES.2006.320437.*

Type-Aware Web Service Composition Using Boolean Satisfiability Solver Nam, Wonhong; Kil, Hyunyoung; Lee, Dongwon; E-Commerce Technology and the Fifth IEEE Conference on Enterprise Computing, E-Commerce and E-Service, 2008 10th IEEE Conference on Jul. 21-24, 2008 pp. 331-334 Digital Object Identifier 10.1109/CECandEEE.2008.108.*

A circuit SAT solver with signal correlation guided learning Feng Lu; Wang, L.-C.; Kwang-Ting Cheng; Huang, R.C.-Y.; Design, Automation and Test in Europe Conference and Exhibition, 2003 2003 pp. 892-897 Digital Object Identifier 10.1109/DATE.2003.1253719.*

L. Zhang and S. Malik ,"Validating SAT solvers using an independent resolution-based checker: Practical implementations and other applications;" *Design Automation and Test in Europe* (2003).

N. Een et al, "Effective preprocessing in SAT through variable and clause elimination", Theory and Applications of Satisfiability Testing, 8th International Conference, SAT 2005. Proceedings (Lecture Notes in Computer Science vol. 3569), 2005, p. 61-75.

L. Zhang, "On subsumption removal and on-the-fly CNF simplification", Theory and Applications of Satisfiability Testing. 8th International Conference, SAT 2005. Proceedings (Lecture Notes in Computer Science vol. 3569), 2005, p. 482-9.

L. Cong et al., "CAMA: a multi-valued satisfiability solver", ICCAD-2003. International Conference on Computer Aided Design (IEEE Cat. No. 03CH37486) p. 326-33, 2003.

\* cited by examiner

RESOLVE TRACE MINIMIZATION

COPYRIGHT & TRADEMARK NOTICES

A portion of the disclosure of this patent document contains material, which is subject to copyright protection. The owner has no objection to the facsimile reproduction by any one of the patent document or the patent disclosure, as it appears in the Patent and Trademark Office patent file or records, but otherwise reserves all copyrights whatsoever.

Certain marks referenced herein may be common law or registered trademarks of third parties affiliated or unaffiliated with the applicant or the assignee. Use of these marks is for providing an enabling disclosure by way of example and shall not be construed to limit the scope of this invention to material associated with such marks.

FIELD OF INVENTION

The present invention relates generally to proof of unsatisfiability and, more particularly, to minimizing the size of a resolve trace generated by a SAT solver.

BACKGROUND

Boolean satisfiability (SAT) has many applications in the area of electronic design automation (EDA), artificial intelligence (AI), and operations research (OR). For example, SAT can be used to simulate the core of many problems in the field of computer-aided design (CAD) of integrated circuits, including logic synthesis, functional verification, equivalence checking, timing analysis, and automatic test pattern generation (ATPG).

SAT solvers are configured to solve a SAT problem posed as a boolean formula. Given a boolean formula F over a set of variables V, the task of a SAT solver is to find an assignment to all variables in V such that the value of F under this assignment is true, or prove that one does not exist. Most SAT solvers require that the boolean formula to be inputted in conjunctive normal form (CNF). CNF is a propositional boolean formula that includes a conjunction (i.e., logical AND) of one or more clauses, where each clause is a disjunction (i.e., logical OR) of one or more literals.

A literal is either a positive or a negative occurrence of a boolean variable (e.g., x, or its negation, −x). A literal may have one of three values: true, false, or undefined. A clause in which one literal is undefined and all the rest are false is called a unit clause. A unit clause forces an assignment of true to the undefined literal to satisfy the formula.

Modern SAT solvers usually maintain a CNF database. The database is modified constantly during the solving process according to mechanisms such as conflict clause learning, boolean constraint propagation and clause deletion. As provided in further detail below, conflict clause learning provides a method for generating a conflict clause which "learns" the root causes (assignments to variables) of a conflict in order to avoid reaching the same conflict again.

More specifically, a conflict clause describes a combination of assignments that should not be repeated due to conflicts in variable assignments. The conflict clause is added to the clause database to help prune the search space that remains to be traversed. A conflict clause is, typically, generated by a chain of resolution steps. The series of conflict clauses generated by a SAT solver can be illustrated by a resolution graph (See FIG. 1, for example).

A resolution graph is generated based on a final conflicting clause and all the clauses that imply a value to a variable without making any decisions until an empty clause is generated. A resolution graph is a proof for unsatisfiability of the CNF formula. The leaves in the graph represent the unsat core. During the solving process, the SAT solver keeps, for each generated conflict clause, an ordered list of resolve sources (i.e., clauses that took part in generating the conflict clause). The set of all resolve sources can be represented by a resolve trace (not shown in FIG. 1).

Generally, it is impossible to know which clauses will be included in the resolution graph before the solving process is over. Therefore, conventional SAT solvers are configured to include all resolve sources for each conflict clause in the resolve trace. A SAT solver may generate hundreds of thousands of conflict clauses during an average run. As a result, a large number of I/O operations may be performed to generate the respective resolve sources in the resolve trace file.

The process of generating a resolve trace degrades the performance of the SAT solver. Further, since in most cases the resolve trace is written to a file, several hundreds of mega bytes of disk space are consumed to store the resolve trace generated during the solving process.

Conventional methods are available that can reduce the size of a resolve trace after the SAT solver has completed execution. Unfortunately, this solution does not solve the above-mentioned problems associated with the large size of the generated resolve trace during the SAT solver run. Systems and methods are needed that can reduce the size of the resolve trace on the fly.

SUMMARY

The present disclosure is directed to a system and corresponding methods that facilitate minimizing the size of a resolve trace generated by a SAT solver.

Certain aspects, advantages and novel features of the invention have been described herein. It is to be understood that not all such advantages may be achieved in accordance with any one particular embodiment of the invention. Thus, the invention may be embodied or carried out in a manner that achieves or optimizes one advantage or group of advantages without achieving all advantages as may be taught or suggested herein.

In accordance with one embodiment, systems and methods for minimizing a resolve trace generated by a SAT solver, before the SAT solver completes reaching a final result for satisfiability of a SAT problem, are provided. The method comprises identifying at least a first clause not needed for determining the final result; and removing at least a first resolve source associated with the first clause from the resolve trace, before the SAT solver continues generating additional clauses, wherein the first clause is a disjunction of one or more literals that define the SAT problem.

In accordance with another embodiment, a method for minimizing a resolve trace comprises selecting a first conflict clause deleted by a SAT solver, wherein the first conflict clause is associated with a first resolve source in a resolve trace and a first counter indicating number of children for the first conflict clause; determining whether the first conflict clause has any children based on value of the first counter; and deleting the first resolve source from the resolve trace, in response to determining that the first conflict clause has no children.

In accordance with yet another embodiment, a system for minimizing a resolve trace generated by a SAT solver, before the SAT solver completes reaching a final result for satisfiability of a SAT problem, the system comprising a logic unit for identifying at least a first clause not needed for determining the final result; and a logic unit for removing at least a first resolve source associated with the first clause from the resolve trace, before the SAT solver continues generating additional clauses, wherein the first clause is a disjunction of one or more literals that define the SAT problem.

In accordance with another embodiment, a computer program product comprising a computer useable medium having a computer readable program is provided. The computer readable program when executed on a computer causes the computer to perform the processes associated with the methods discussed above.

One or more of the above-disclosed embodiments in addition to certain alternatives are provided in further detail below with reference to the attached figures. The invention is not, however, limited to any particular embodiment disclosed.

BRIEF DESCRIPTION OF THE DRAWINGS

Embodiments of the present invention are understood by referring to the figures in the attached drawings, as provided below.

Features, elements, and aspects of the invention that are referenced by the same numerals in different figures represent the same, equivalent, or similar features, elements, or aspects, in accordance with one or more embodiments.

DETAILED DESCRIPTION OF PREFERRED EMBODIMENTS

Figure 1:
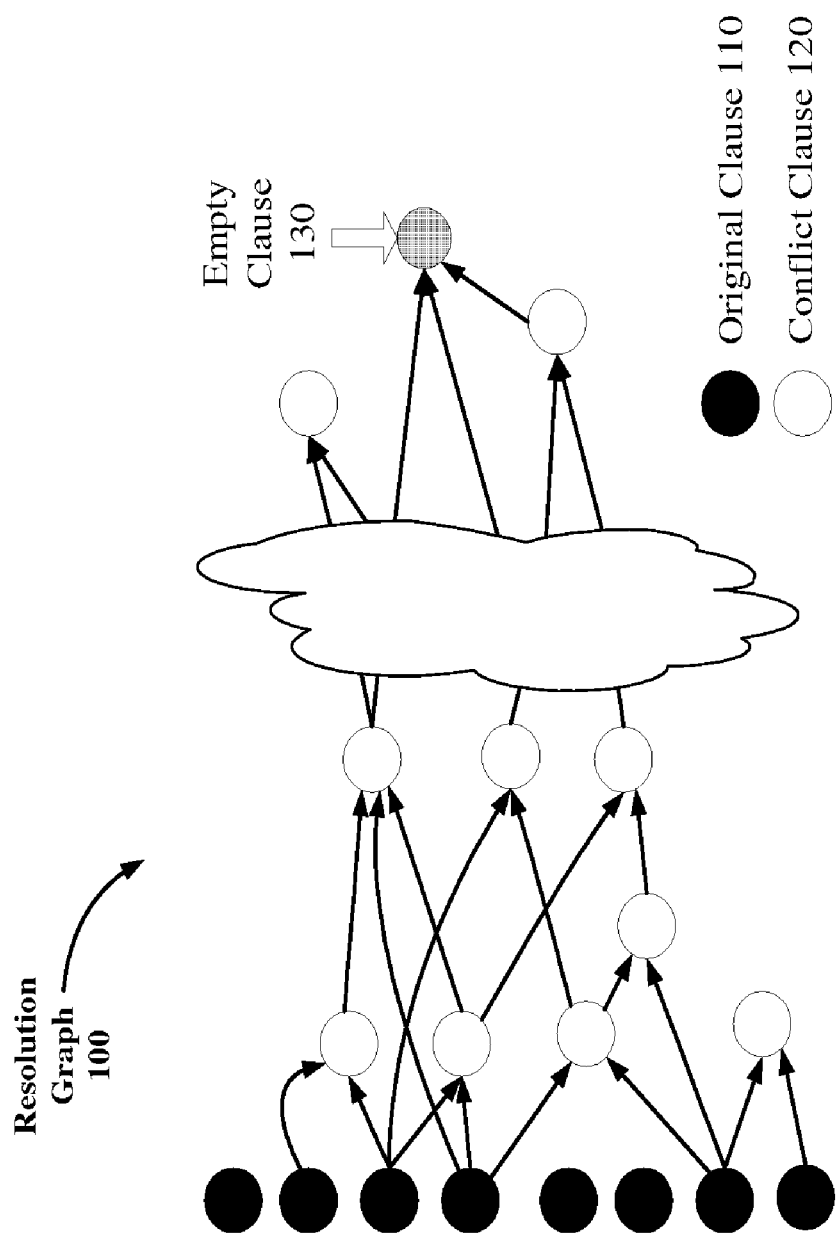
FIG. 1 illustrates a resolution graph generated by a SAT solver, in accordance with one embodiment.

The present disclosure is directed to systems and corresponding methods that facilitate minimizing the size of a resolve trace, generated by a SAT solver, during the solving process (i.e., while the SAT solver is running). In the following, one embodiment of the invention is disclosed by way of example as applicable to DPLL (Davis-Putnam-Logemann-Loveland) solvers that incorporate conflict clause learning and non-chronological backtracking. It is noteworthy, however, that the concepts and principals of the present invention for resolve trace minimization can be applied to any solving scheme that generates and deletes conflict clauses.

In the following, numerous specific details are set forth to provide a thorough description of various embodiments of the invention. Certain embodiments of the invention may be practiced without these specific details or with some variations in detail. In some instances, certain features are described in less detail so as not to obscure other aspects of the invention. The level of detail associated with each of the elements or features should not be construed to qualify the novelty or importance of one feature over the others.

The DPLL algorithm is a complete, backtracking-based algorithm for solving a CNF-SAT problem. In accordance with one aspect of the invention, the basic backtracking algorithm runs by choosing a literal, assigning a truth value to it, simplifying the formula and then recursively checking if the simplified formula is satisfiable. If this is the case, the original formula is deemed satisfiable; otherwise, the same recursive check is done assuming the opposite truth value.

The DPLL algorithm can be enhanced over the backtracking algorithm by conflict clause learning, non chronological backtracking, unit propagation, and pure literal elimination. (See L. Zhang, C. F. Madigan, M. W. Moskewicz and S. Malik. Efficient conflict driven learning in boolean satisfiability solver. *In International Conference on Computer Aided Design*, pages 279-285, 2001, incorporated herein by reference in entirety.)

An exemplary DPLL algorithm with learning in accordance with one embodiment is provided below:

```
while(1) {
    if (decide_next_branch( ))
        while (deduce( ) == CONFLICT) {
            blevel = analyze_conflicts( );
            if (blevel == 0) return UNSAT;
            else bactrack(blevel);
        }
    else
        return SAT;
}
```

The above exemplary algorithm searches for a satisfying assignment by iteratively choosing a value for a variable (e.g., decide_next_branch( )). For example, when all variables are assigned, the algorithm halts and outputs a satisfying assignment. Otherwise, the implications of this assignment are carried through by the deduce( ) function. If deduce( ) reveals a conflict, the reason for the conflict is analyzed and a conflict clause is added to a database that can be represented by a resolution graph 100 shown in FIG. 1.

A conflict clause 120 summarizes the combination of values that lead to the conflict and prevents this combination from being assigned a second time. The function analyze_conflicts( ) returns a decision level to which the algorithm backtracks. In a first level (e.g., ground level), there exists a conflict without a decision, which means that the formula is unsatisfiable. Otherwise, the algorithm backtracks to a second level (e.g., blevel) and continues the search.

In certain embodiments, the decide_next_branch( ) function chooses a variable that is undefined and assigns to it either a true or a false value. This is a decision that uses a decision variable. The mechanism that controls the way the decision is made is referred to as the decision heuristic, for example. Each decision is associated with a number that reflects the decision level. In one embodiment, the implications that result from one decision are associated with the same decision level. When constant values are revealed, the implications are associated with the first decision level (e.g., ground level).

Boolean constraint propagation (BCP) is the process of propagating the effect of an assignment. This is the task of the function deduce( ) in the above algorithm. Each assignment may cause several clauses to become a unit clause. Each unit clause implies an assignment, which may in turn result in more unit clauses. During BCP, this process is iterated until no further assignments can be implied.

In certain embodiments, two literals in every clause are marked as watched literals. A clause of length n (with n>=2) can become a unit clause after n−1 of its literals have been assigned false, for example. A clause that is not unit cannot cause an implication. So as long as the two watched literals of a clause are undefined (or true) a clause is not unit, and there is no need to examine the clause during BCP. Whenever a literal is assigned false, one or more clauses in which the literal is watched are examined to see whether said one or more clauses have become unit.

Accordingly, a conflict is deemed to happen when BCP propagates a certain assignment and discovers a clause with all literals set to false. A clause with all literals set to false is considered a conflicting clause. During conflict analysis, the chain of implications that resulted in the conflict is analyzed, and the reason for the conflict is summarized in a conflict clause. As such, the conflict clause describes a combination of assignments that should not be repeated due to the detected conflict, thus pruning the search space that remains to be traversed.

As noted earlier, a conflict clause is generated by a chain of resolution steps (hereinafter referred to as "resolve sources") and is added to a resolution graph 100, as shown in FIG. 1. In the exemplary resolution graph 100 in FIG. 1, each node represents a clause. The root nodes represent original clauses 110 of the formula being solved by the SAT solver, and the branch nodes represent conflict clauses 120 that are generated during the SAT solver's run.

An edge from a node corresponding to a first clause to a node corresponding to a second clause represents a parent-child relationship, wherein the first clause is the parent for the second clause, and the second clause is the child of the first clause. An empty clause 130 of an unsatisfiable run can be generated by a resolution using the final conflicting clause and a subset of clauses that implied a value to a variable without making any decisions.

In some embodiments, an algorithm according to L. Zhang and S. Malik (See "Validating SAT solvers using an independent resolution-based checker: Practical implementations and other applications;" *Design Automation and Test in Europe* (2003) incorporated herein by reference in entirety) may be utilized to calculate the unsat core, for example. This exemplary algorithm uses information from the SAT solver's run.

Preferably, the SAT solver keeps for each generated conflict clause 120 an ordered list of resolve sources (not shown in FIG. 1) that took part in generating the conflict clause 120. The ordered list of resolve sources generated by the SAT solver during a run is stored in a resolve trace (see FIGS. 2 through 6). Each resolve source can comprise an original clause that exists in the CNF formula, or a conflict clause which can be calculated using its own resolve sources, for example.

The following algorithm represents an exemplary method, in accordance with one embodiment, for updating the set of resolve sources (ρ) for a newly generated conflict clause (cc), wherein a child_count field is associated with each resolve source.

curr_ρ—the resolvents of a newly generated conflict clause cc

```
cc. ρ = curr_ρ
cc.child_count = 0
for each (c ∈ cc. ρ )
    ++ c.child_count
```

In accordance with one embodiment, for each conflict clause (cc), the following information is stored in the resolve trace: (1) the resolve sources associated with the conflict clause (cc.ρ), and (2) a counter (cc.child_count) that represents the number of clauses that have a resolve source list and wherein the conflict clause is one of their resolve sources.

The following exemplary algorithm, in accordance with one embodiment, may be used to delete the redundant resolve sources in a resolve trace, preferably, after a function that deletes the respective clauses from the resolution graph 100 is executed. In this exemplary algorithm, the resolve sources of the original clauses is an empty set.

del_list=a list of clauses that were deleted in the last clause deletion operation

```
for each (c ∈ del_list)
    DeleteResolvent(c)
    DeleteResovents(c)
    {
        if (c.child_count == 0)
        {
            if (¬empty(c. ρ ) ∧ c.deleted)
            {
                for each (cl ∈ c. ρ )
                {
                    --cl.child_count
                    DeleteResovents(cl)
                }
                delete c. ρ
            }
        }
    }
```

Based on the above algorithm, clauses that have been deleted (e.g., during a cleanup process) and do not have descendants are identified. If it is determined that a deleted clause (c1) does not have descendants, then there will be no clause (c2) generated in the resolution graph 100 as part of a future run such that the deleted clause (c1) is an ancestor of the other clause (c2).

Therefore, since the deleted clause (c1) will no longer participate in generation of new clauses for the resolution graph 100, the resolve sources associated with the deleted clause are preferably removed from the resolve trace and the child count for each one of the resolve source's parents is decremented. Preferably, the above process is recursively applied to the parents of the removed resolve sources to determine whether any further resolve source may be deleted from the resolve trace.

In contrast, when the SAT solver deletes, from the resolution graph 100, a conflict clause (cc) which has one or more descendants (e.g., cc.child count>=1), the corresponding resolve source (cc.ρ) is not deleted from the resolve trace, because it is not known whether a descendant of the deleted conflict clause will take part in the resolution graph 100 during future runs.

To clarify the above approach, we refer to FIGS. 2 through 7 illustrating an exemplary resolve trace that is minimized in accordance with one embodiment.

Figure 2:
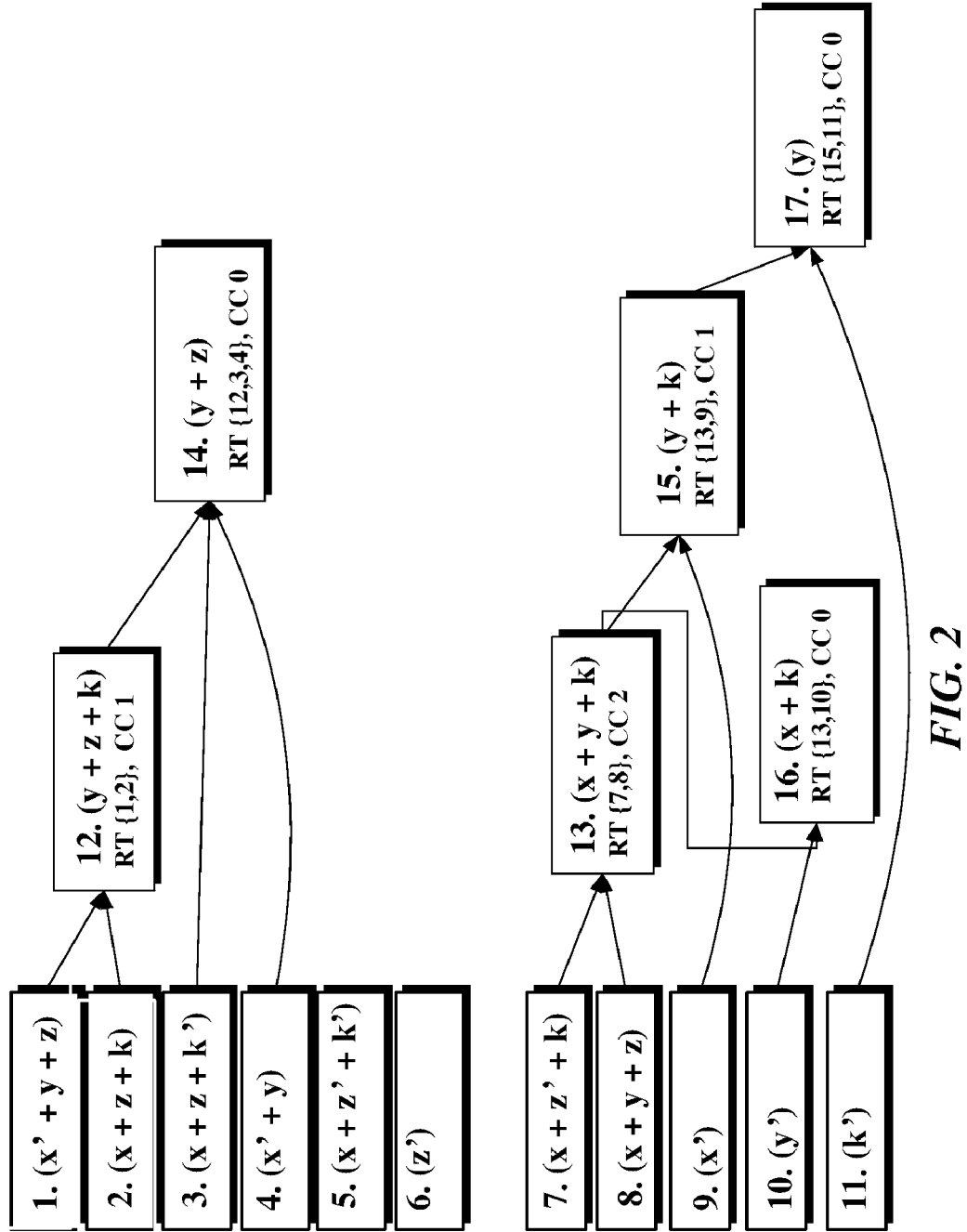
FIGS. 2 through 6 are block diagrams of a resolution trace generated and minimized by a SAT solver, in accordance with one embodiment.

Referring to FIG. 2, a resolve trace generated by a SAT solver based on the input of original clauses 1 through 11 is illustrated. Clauses 12 through 17 represent the conflict clauses and the respective resolve sources in the resolve trace for each conflict clause. Note that the plus sign is an indication of a disjunction (i.e., a logical OR) between the literals of each clause. As provided earlier, the SAT solver evaluates the conjunction (i.e., a logical AND) between two or more clauses and reports a conflict by generating a conflict clause.

As shown, clause 12 is a conflict clause generated from conjunction of clauses 1 and 2, where the SAT solver has detected a conflict in values assigned to the variables in the literals. For example, the disjunction of literals (y+z+k) is a representative of information recorded in the resolution graph 100 for conflict clause 12. "RT {1,2}, CC1" is an exemplary representative of information recorded in a resolve trace for conflict clause 12. "RT {1,2}" indicates, for example, that clause 12 is generated as a resolution of clauses 1 and 2. "CC1" is a child counter and indicates, for example, that clause 12 has one child.

As such, in accordance with one embodiment, the resolve trace for each conflict clause comprises a first field that comprises information about the resolution history of the conflict clause, and a second field that comprises information about the number of children for the conflict clause in the resolve trace. Referring to FIG. 2, clauses 13 through 17 are conflict clauses generated during the SAT solver run, wherein the resolution history and the number of children for each conflict clause is recorded in the resolve trace in the manner provided above.

Figure 3:
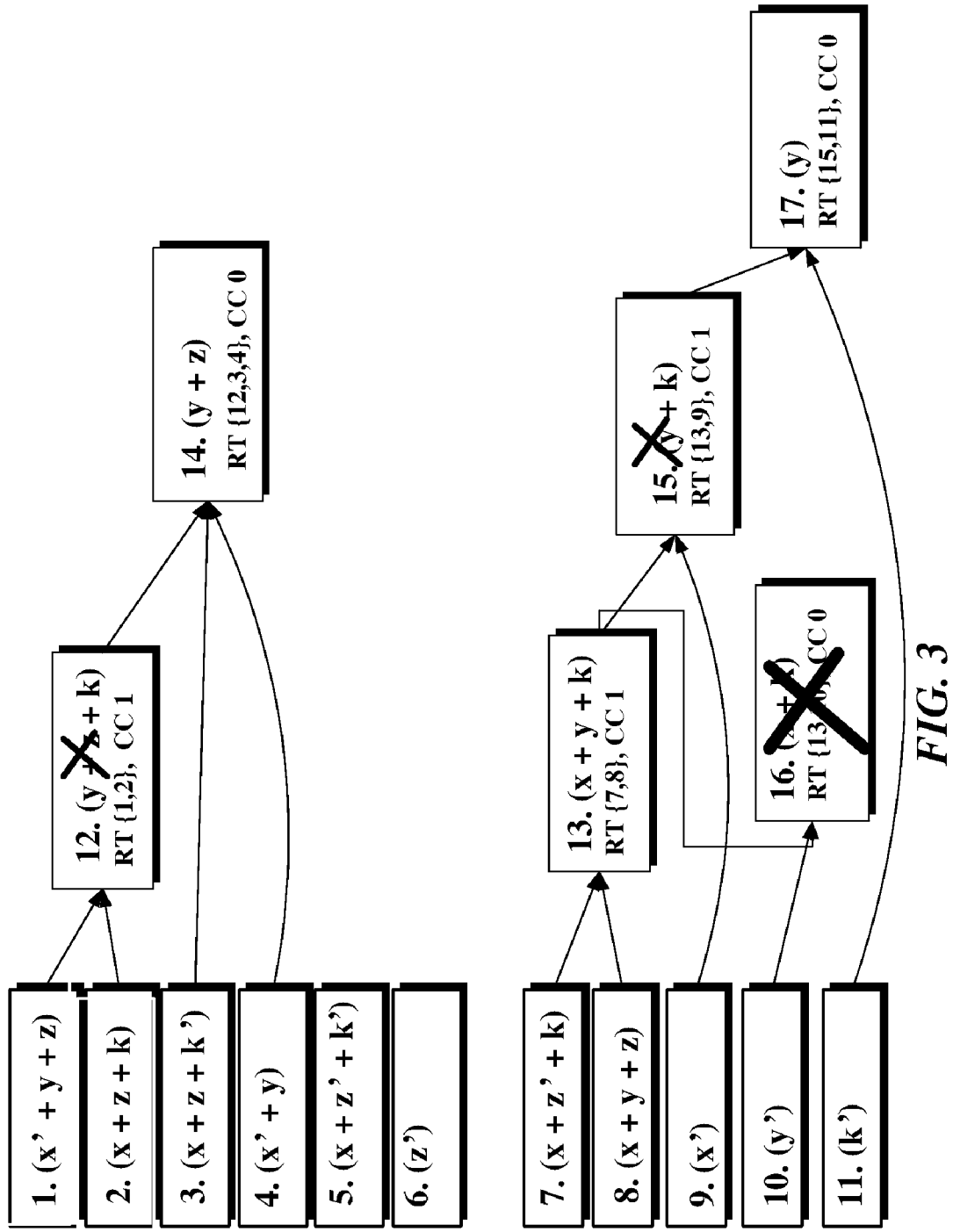

Referring to FIG. 3, and for the purpose of example assuming that the SAT solver halts to delete certain clauses from the resolution graph 100, one or more clauses are selected based on a heuristic approach, in accordance with one embodiment. In this example, clauses 12, 15 and 16 are selected for deletion. As shown, the disjunction of literals (y+z+k), (y+k) and (x+k) respectively representing the conflict clauses 12, 15 and 16 are crossed out to indicate the deletion of said clauses from the resolution graph 100.

Advantageously, in accordance with one or more embodiments, after one or more clauses are deleted from the resolution graph 100, a recursive procedure is applied to the resolve sources in the resolve trace that corresponds to the deleted clauses to determine if any resolve sources can be removed from the resolve trace. It is noteworthy that in the conventional art, SAT solver's deletion of conflict clauses from the resolution graph 100 is not followed by a procedure for removing the corresponding resolve sources from the resolve trace.

Referring back to FIG. 3, in one embodiment, the corresponding child count for each deleted clause is checked to determine if said deleted clauses have any descendents. This determination can be made, for example, by evaluating the child count field for each clause. As shown, the child count field for clause 16 indicates that the clause has no children in the resolve trace (e.g., CC0).

Accordingly, since clause 16 is already deleted from the resolution graph 100 and, according to its child count, clause 16 is not an ancestor of an existing clause (e.g., CC0), the resolve sources for clause 16 can be removed from the resolve trace without effecting the resolution history for any future clauses that are generated as part of the unsat core. That is, since deletion of clause 16 means that its literals will no longer participate in the solving process, there is no need to keep a history of resolve sources for clause 16.

As shown in FIG. 3, while clauses 12 and 15 (e.g., represented by disjunction of literals (y+z+k) and (y+k), respectively) are deleted from the resolution graph 100, their corresponding resolve sources (e.g., RT {1,2} and RT {13,9}) are not removed from the resolve trace. This is because the child count of clauses 12 and 15 is larger than zero. Therefore, said resolve sources are not deleted, since it is possible that clauses 12 and 15 will be used in generating the proof of unsatisfiability and the unsat core. Therefore, the resolve sources of clauses 12 and 15 will be needed for reconstructing their literals.

As shown in FIGS. 3 through 6, the resolve trace can be represented in accordance with one embodiment as a tree with the roots of the tree being represented by original clauses at the bottom of the tree hierarchy, and the conflict clauses as the branches or the leaves at the upper levels of the tree hierarchy. Depending on implementation, a B-Tree data structure, a data array, a linked list or other suitable data structure may be utilized to construct the index or the tree hierarchy and the relationships between each node of the tree.

In certain embodiments, the resolution graph 100 (FIG. 1) and the resolve trace (FIGS. 3 through 6) may be implemented as part of a single tree hierarchy with each node providing information about the corresponding literals, resolve sources and child counters for each clause. In alternative embodiments, the resolution graph 100 and the resolve trace may be implemented by way of constructing separate and independent data structures.

Figure 4:
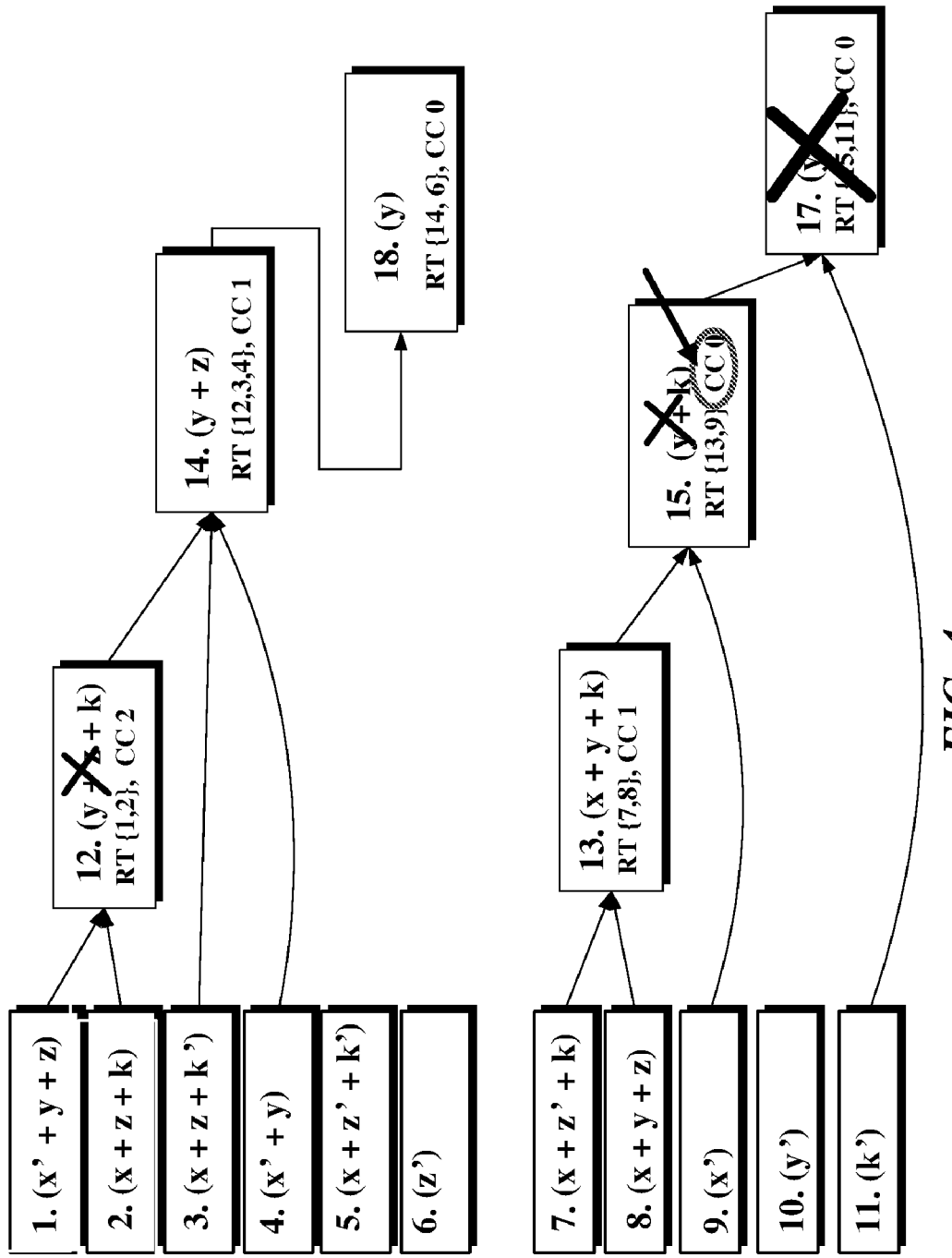

As briefly noted earlier and referring back to FIGS. 3 through 6, in one embodiment, the removal of the resolve sources from the resolve trace is performed recursively by traversing the parents of each deleted conflict clause. FIG. 4, for example, illustrates the resolve trace after SAT solver run has generated additional conflict clause 18 and has deleted conflict clause 17.

As shown in FIG. 4, the deletion of conflict clause 17 leads to removal of the corresponding resolve source for clause 17 from the resolve trace, as clause 17 has no children (CC0). Note that removal of the resolve trace associated with clause 17 results in the child count for clause 15 being decremented. This indicates that clause 15, parent of deleted clause 17, now has no children, and thus can be removed from the resolve trace, since clause 15 was previously deleted from the resolution graph 100.

Figure 5:
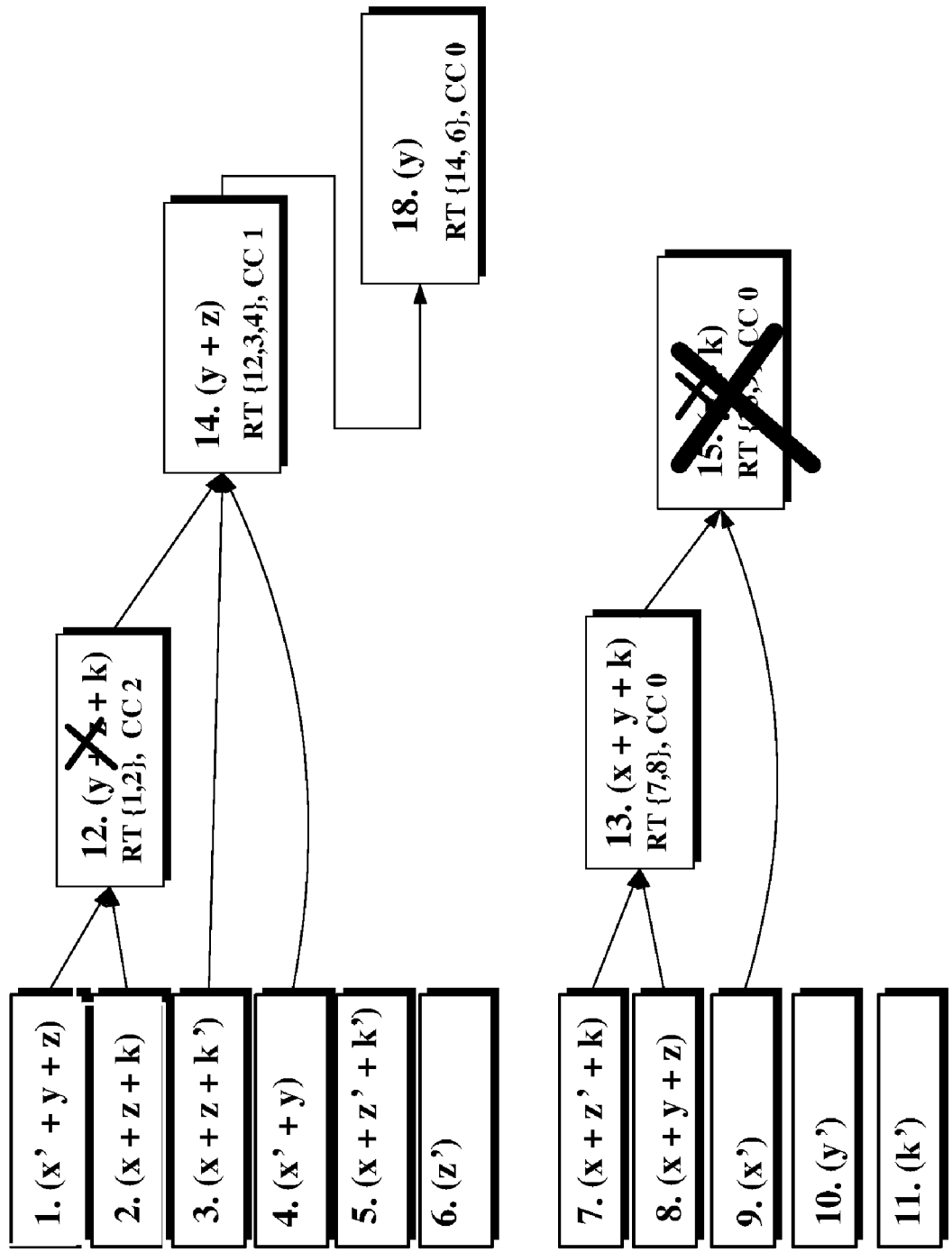

As shown, clause 15 was deleted from the resolution graph in a previous run. Therefore, the corresponding resolve source to clause 15 (i.e., resolve source 15) can now be removed from the resolve trace, as a part of the recursive process discussed above. The final step in removal of the resolve sources 15 is illustrated in FIG. 5. Note that the parent of clause 15 (i.e., clause 13) has no children, but is not removed from the resolve trace despite of the recursive procedure. This is because clause 13 (here represented by disjunction of literals (x+y+k)) was not deleted from the resolution graph.

Figure 6:
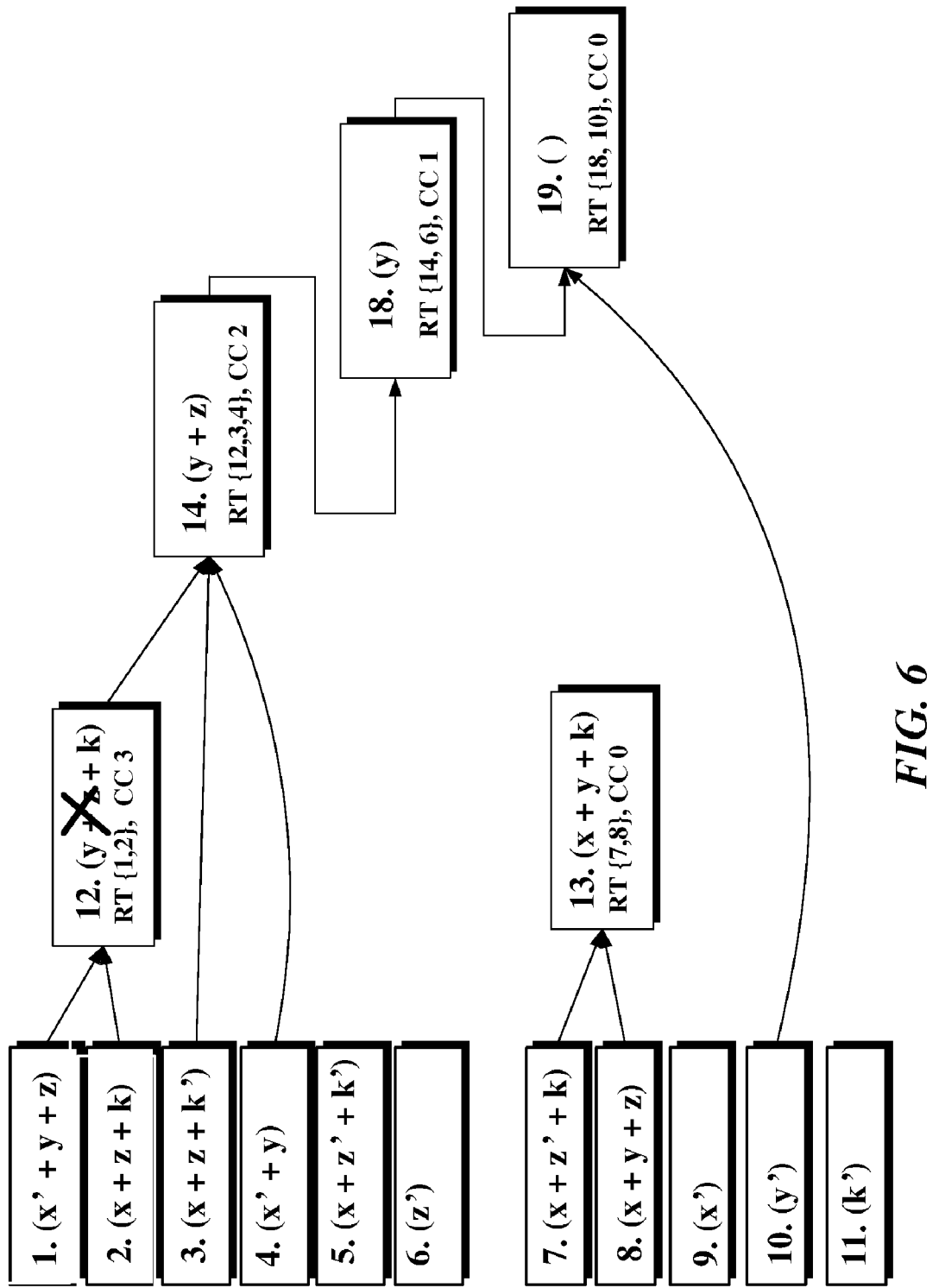

FIG. 6 illustrates an exemplary resolve trace minimized in accordance with one aspect of the invention, wherein clause 19 is the empty clause generated as a resolution of clauses 18 and 10. Referring to the deleted resolve sources in FIGS. 2 through 5 in comparison with the resolve sources remaining in the minimized resolve trace of FIG. 6, resolve sources of clauses 15, 16 and 17 have been advantageously removed without affecting the meaningful aspects of the unsat core and proof of unsatisfiability generation.

Figure 7:
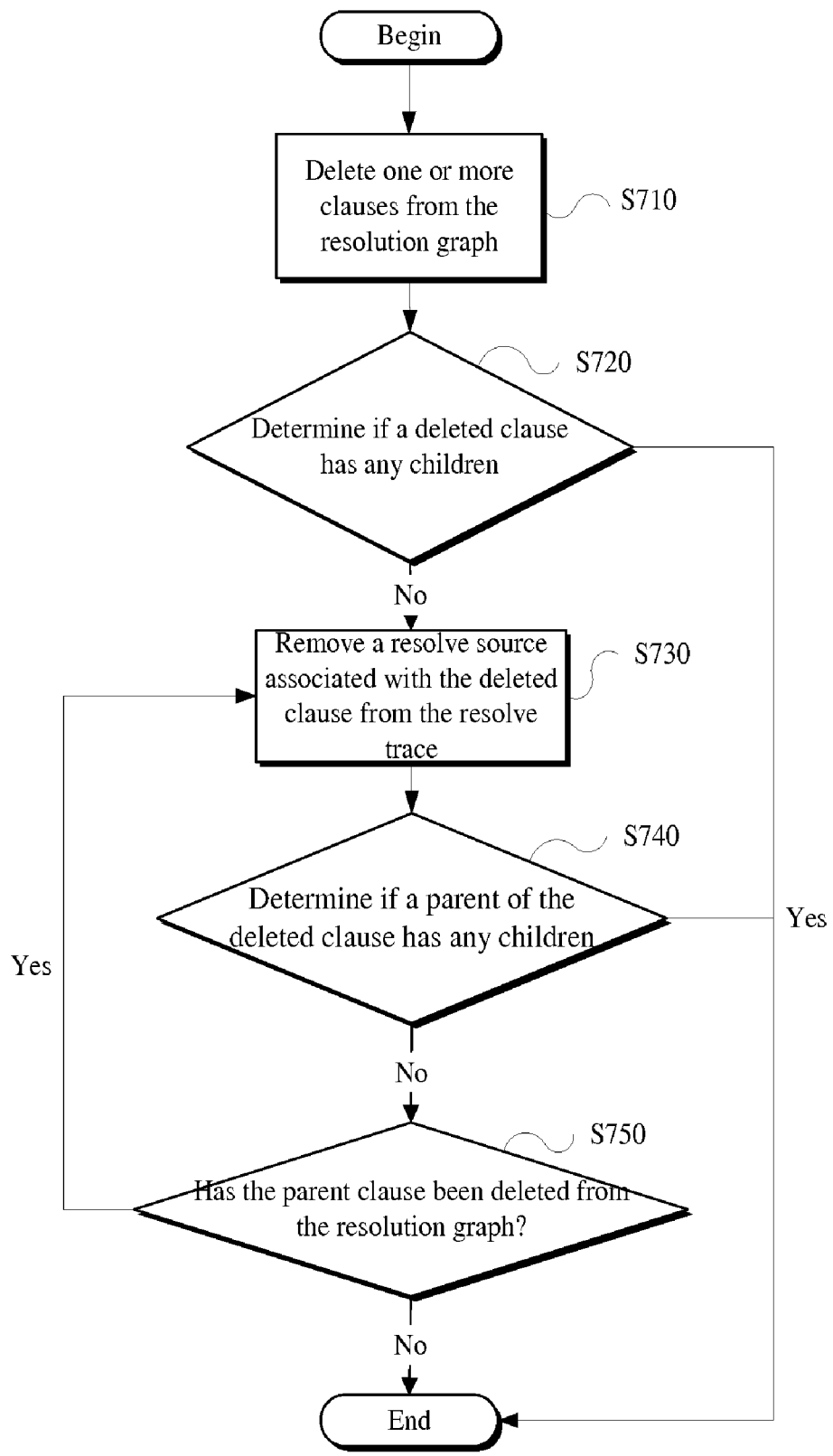
FIG. 7 is a flow diagram of a method for minimizing a resolve trace, in accordance with a one embodiment.

Referring to FIG. 7, a method for generating a minimized resolve trace in accordance with one embodiment is provided. Accordingly, when one or more clauses in the resolution graph are deleted (S710), it is determined if the deleted clause has any children (S720). If not, the resolve sources associated with the deleted clause are removed from the resolve trace (S730), otherwise the resolve sources are not removed.

In one embodiment, if the resolve sources are removed, then it is determined if a clause, that is the parent of the clause where its resolve sources were removed, has any other children (S740). If the parent does not have any children, then it is determined if the clause corresponding to the parent of the removed resolve sources has been deleted from the resolution graph (S750). If so, then the corresponding resolve sources (i.e., the parent resolve sources) are removed from the resolve trace (S730).

The above process is performed recursively for the parent of each resolve source that is removed from the resolve trace. Thus, a resolve source is removed from the resolve trace in accordance with one embodiment, when the following two conditions are met: (1) the clause corresponding to the resolve sources is deleted from the resolution graph, and (2) the clause corresponding to the resolve sources has no children left in the resolve trace.

Figure 8A:
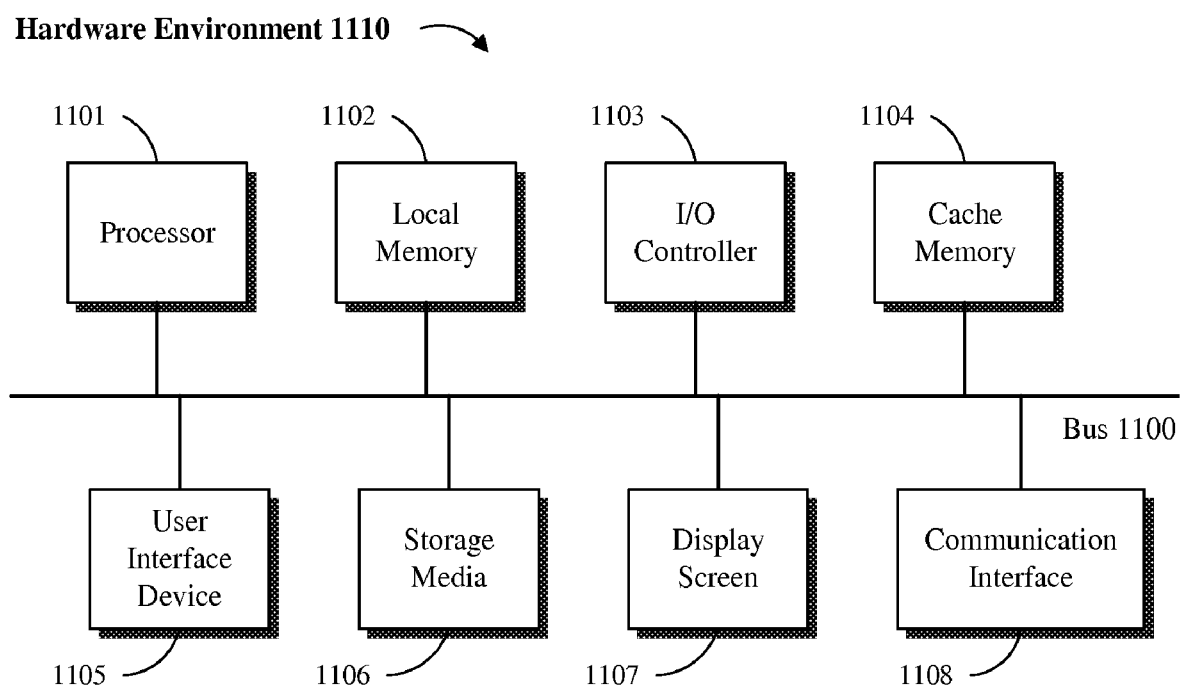
FIGS. 8A and 8B are block diagrams of hardware and software environments in which a system of the present invention may operate, in accordance with one or more embodiments.
Figure 8B:
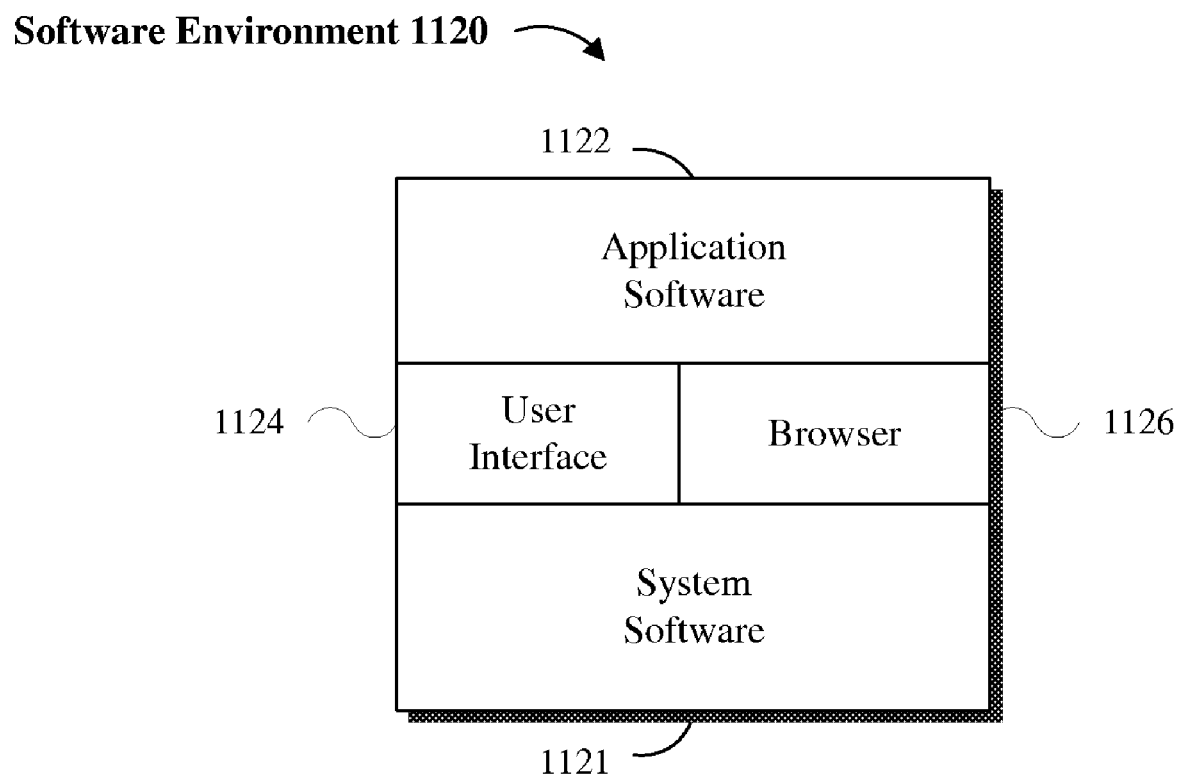

Referring to FIGS. 8A and 8B, a computing system environment in accordance with an exemplary embodiment of the invention is composed of a hardware environment 1110 and a software environment 1120. The hardware environment 1110 comprises the machinery and equipment that provide an execution environment for the software; and the software provides the execution instructions for the hardware as provided below.

As provided here, the software elements that are executed on the illustrated hardware elements are described in terms of specific logical/functional relationships. It should be noted, however, that the respective methods implemented in software may be also implemented in hardware by way of configured and programmed processors, ASICs (application specific integrated circuits), FPGAs (Field Programmable Gate Arrays) and DSPs (digital signal processors), for example.

Software environment 1120 is divided into two major classes comprising system software 1121 and application software 1122. System software 1121 comprises control programs, such as the operating system (OS) and information management systems that instruct the hardware how to function and process information.

In a preferred embodiment, the SAT solver of the invention and the logic code for the exemplary resolve trace minimization method are implemented as application software 1122 executed on one or more hardware environments. Application software 1122 may comprise but is not limited to program code, data structures, firmware, resident software, microcode or any other form of information or routine that may be read, analyzed or executed by a microcontroller.

In an alternative embodiment, the invention may be implemented as computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate or transport the program for use by or in connection with the instruction execution system, apparatus or device.

The computer-readable medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk read only memory (CD-ROM), compact disk read/write (CD-R/W) and digital video disk (DVD).

Referring to FIG. 8A, an embodiment of the application software 1122 can be implemented as computer software in the form of computer readable code executed on a data processing system such as hardware environment 1110 that comprises a processor 1101 coupled to one or more memory elements by way of a system bus 1100. The memory elements, for example, can comprise local memory 1102, storage media 1106, and cache memory 1104. Processor 1101 loads executable code from storage media 1106 to local memory 1102. Cache memory 1104 provides temporary storage to reduce the number of times code is loaded from storage media 1106 for execution.

A user interface device 1105 (e.g., keyboard, pointing device, etc.) and a display screen 1107 can be coupled to the computing system either directly or through an intervening I/O controller 1103, for example. A communication interface unit 1108, such as a network adapter, may be also coupled to the computing system to enable the data processing system to communicate with other data processing systems or remote printers or storage devices through intervening private or public networks. Wired or wireless modems and Ethernet cards are a few of the exemplary types of network adapters.

In one or more embodiments, hardware environment 1110 may not include all the above components, or may comprise other components for additional functionality or utility. For example, hardware environment 1110 can be a laptop computer or other portable computing device embodied in an embedded system such as a set-top box, a personal data assistant (PDA), a mobile communication unit (e.g., a wireless phone), or other similar hardware platforms that have information processing and/or data storage and communication capabilities.

In some embodiments of the system, communication interface 1108 communicates with other systems by sending and receiving electrical, electromagnetic or optical signals that carry digital data streams representing various types of information including program code. The communication may be established by way of a remote network (e.g., the Internet), or alternatively by way of transmission over a carrier wave.

Referring to FIG. 8B, application software 1122 can comprise one or more computer programs that are executed on top of system software 1121 after being loaded from storage media 1106 into local memory 1102. In a client-server architecture, application software 1122 may comprise client software and server software. For example, in one embodiment of the invention, client software is executed on a computing terminal and server software is executed on a server machine.

Software environment 1120 may also comprise browser software 1126 for accessing data available over local or remote computing networks. Further, software environment 1120 may comprise a user interface 1124 (e.g., a Graphical User Interface (GUI)) for receiving user commands and data. Please note that the hardware and software architectures and environments described above are for purposes of example, and one or more embodiments of the invention may be implemented over any type of system architecture or processing environment.

It should also be understood that the logic code, programs, modules, processes, methods and the order in which the respective steps of each method are performed are purely exemplary. Depending on implementation, the steps can be performed in any order or in parallel, unless indicated otherwise in the present disclosure. Further, the logic code is not related, or limited to any particular programming language, and may comprise of one or more modules that execute on one or more processors in a distributed, non-distributed or multi-processing environment.

The present invention has been described above with reference to preferred features and embodiments. Those skilled in the art will recognize, however, that changes and modifications may be made in these preferred embodiments without departing from the scope of the present invention. These and various other adaptations and combinations of the embodiments disclosed are within the scope of the invention and are further defined by the claims and their full scope of equivalents.

What is claimed is:

1. A computer-implemented method for minimizing a resolve trace generated by a SAT solver to solve a problem, the method comprising:

defining the problem as an expression comprising one or more variables, wherein the problem is solved by assigning values to the variables such that the expression evaluates to a predetermined value;

generating a plurality of clauses, wherein each clause assigns values to one or more of the variables, and wherein a subset of the generated clauses is used to determine a final result that indicates whether there is a solution to the problem;

identifying at least a first clause not needed for determining the final result; and removing at least a first resolve source associated with the first clause from the resolve trace, before the SAT solver continues generating additional clauses.

2. The method of claim 1, further comprising removing the first resolve source from the resolve trace, in response to said first clause not having any children.

3. The method of claim 2, wherein whether the first clause has any children is determined based on a first counter associated with the first clause.

4. The method of claim 3, wherein the value of the first counter represents the number of children for the first clause.

5. The method of claim 3, wherein the first counter is incremented if during the SAT solver solving the SAT problem a child clause for the first clause is generated by the SAT solver.

6. The method of 3, wherein the first counter is decremented if during minimizing the resolve trace, at least a resolve source for a child clause for the first clause is deleted.

7. The method of claim 2, further comprising:

identifying a second clause being a parent of the first clause; and removing a second resolve source associated with the second clause in response the second clause not having any children and the second clause not being needed for determining the final result.

8. The method of claim 7, further comprising recursively performing the identifying process for resolve sources associated with a parent clause of a deleted clause.

9. The method of claim 8, further comprising recursively performing the removing process for resolve sources associated with the parent clause of the deleted clause, wherein the parent clause does not have any children and is not needed for determining the final result.

10. A computer-implemented method for minimizing a resolve trace generated by a SAT solver to solve a problem, the method comprising:

defining the problem as an expression comprising one or more variables, wherein the problem is solved by as assigning values to the variables such that the expression evaluates to a predetermined value;

generating a plurality of clauses, wherein each clause assigns values to one or more of the variables, and wherein a subset of the generated clauses is used to determine a final result that indicates whether there is a solution to the problem;

selecting a first conflict clause deleted by the SAT solver, wherein the first conflict clause is associated with a first resolve source in the resolve trace and a first counter indicating number of children for the first conflict clause;

determining whether the first conflict clause has any children based on value of the first counter; and deleting the first resolve source from the resolve trace, in response to determining that the first conflict clause has no children.

11. The method of claim 10, further comprising decrementing a second counter indicating number of children for a parent of the first conflict clause.

12. The method of claim 11, further comprising:

removing a second resolve source associated with the parent, in response determining that the parent has no children and if the parent was previously deleted by the SAT solver.

13. The method of claim 12, wherein the parent was deleted according to a heuristic approach.

* * * * *